United States Patent
Otaka (10) Patent No.: US 7,088,980 B2
(45) Date of Patent: Aug. 8, 2006

(54) FREQUENCY CONVERTER WITH NONLINEAR DISTORTION CANCELLATION

(75) Inventor: Shoji Otaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 726 days.

(21) Appl. No.: 10/180,017

(22) Filed: Jun. 27, 2002

(65) Prior Publication Data

US 2003/0007377 A1 Jan. 9, 2003

(30) Foreign Application Priority Data

Jun. 29, 2001 (JP) ......................................... 2001-200160

(51) Int. Cl.
*H04B 1/26* (2006.01)

(52) U.S. Cl. ......................... 455/323; 455/296; 330/149
(58) Field of Classification Search ................. 455/323, 455/296, 315, 251.1, 216, 326; 375/296; 330/149, 124 R, 151

See application file for complete search history.

(56) References Cited

U.S. PATENT DOCUMENTS 5,917,375 A * 6/1999 Lisco et al. ................. 330/151
6,230,001 B1 * 5/2001 Wyse ........................... 455/326
6,242,979 B1 * 6/2001 Li ................................ 330/149
6,768,379 B1 * 7/2004 Umeda et al. ............... 330/261
6,794,938 B1 * 9/2004 Weldon ........................ 330/149
2002/0126767 A1 * 9/2002 Ding et al. ................... 375/296

FOREIGN PATENT DOCUMENTS

| JP | 1-221905 | 9/1989 |
| JP | 2001-127555 | 5/2001 |

OTHER PUBLICATIONS

Yongwang Ding, et al., "A +18dBm IIP3 LNA in 0.35μm CMOS", ISSCC 2001/Session 10/Wireless Building Blocks I / 10.5, 2001 IEEE International Solid-State Circuits Conference, Feb. 6, 2001, 10 pages.

* cited by examiner

*Primary Examiner*—Edward F. Urban
*Assistant Examiner*—Blane J. Jackson
(74) *Attorney, Agent, or Firm*—Oblon, Spivak, McClelland, Maier & Neustadt, P.C.

(57) ABSTRACT

A frequency converter comprises a first mixer which frequency-converts an input signal with a first conversion gain in accordance with a local signal, a second mixer which frequency-converts the input signal with a second conversion gain lower than the first conversion gain in accordance with the local signal, and an adder which adds the output signals of the first and second mixers in opposite phase to each other in order to reduce distortion.

19 Claims, 8 Drawing Sheets

FREQUENCY CONVERTER WITH NONLINEAR DISTORTION CANCELLATION

CROSS-REFERENCE TO RELATED APPLICATIONS

This application is based upon and claims the benefit of priority from the prior Japanese Patent Application No. 2001-200160, filed Jun. 29, 2001, the entire contents of which are incorporated herein by reference.

BACKGROUND OF THE INVENTION

1. Field of the Invention

The present invention relates to a frequency converter and a radio communication apparatus with the same.

2. Description of the Related Art

In recent years, miniaturization, reduction in costs and low power consumption of radio terminals such as portable telephones, and portable information terminals have been developed energetically. In order to satisfy request of both of miniaturization and reduction in costs of the radio terminal, there is employed a method of realizing a circuit (a circuit handling a signal of a RF band) used for the radio unit of the terminal by IC (integrated circuit) as much as possible.

On the other hand, the low power consumption of the radio terminal is realized mainly by improvement of the property of a device including active elements such as transistors and passive elements such as capacitors and improvement of a circuit technique thereof.

As one of functional circuits in the radio unit of the radio terminal is used a frequency converter which converts a received signal into a lower frequency signal, and a transmission signal into a higher frequency signal. For example, a single balance mixer (SBM) and a double balance mixer (DBM) are known as conventional frequency converters.

The frequency converter such as SBM and DBM includes a problem to produce distortion, particularly the third order distortion IM3 (the third order intermodulation distortion) in a frequency conversion output signal due to the non-linearity of the Gm amplifiers and differential pair of transistors. The simplest method for reducing the distortion by a circuit technique is to increase an operating current flowing through the Gm amplifiers and a differential pair of transistors constructing a current switch.

However, in a method for making distortion reduce by increasing the operating currents of the Gm amplifiers and differential pair of transistors, if input referred third order incept point (IIP3) generally known as index of distortion must be improved by 6 dB, it is necessary to increase about 2 times the operating current. This is undesirable in terms of the low power consumption.

BRIEF SUMMARY OF THE INVENTION

It is an object of the present invention to provide a frequency converter which reduces distortion without an increase of a large amount of operating current.

According to the first aspect of the invention, there is provided A frequency converter supplied with an input signal and a local signal, comprising: a first mixer which frequency-converts the input signal with a first conversion gain in accordance with the local signal, to generate a first output signal; a second mixer which frequency-converts the input signal with a second conversion gain lower than the first conversion gain in accordance with the local signal, to generate a second output signal; and an adder which adds the first output signal and the second output signal in opposite phase to each other to generate a frequency-converted output signal.

According to the second aspect of the invention, there is provided a frequency converter comprising: a first mixer supplied with an input signal and a first local signal, and configured to frequency-convert the input signal with a first conversion gain in accordance with the first local signal, to generate a first output signal; a second mixer supplied with the input signal and a second local signal whose phase differs from that of the first local signal, and configured to frequency-convert the input signal with a second conversion gain lower than the first conversion gain in accordance with the second local signal and generate a second output signal; an adder which adds the first output signal and the second output signal in opposite phase to each other, to generates a frequency-converted output signal; and a phase shifter supplied with an original local signal, and configured to phase-shift the original local signal and generate the first local signal and the second local signal.

DETAILED DESCRIPTION OF THE INVENTION

The embodiments of the present invention will now be described with reference to the accompanying drawings.

(The First Embodiment)

Figure 1A:
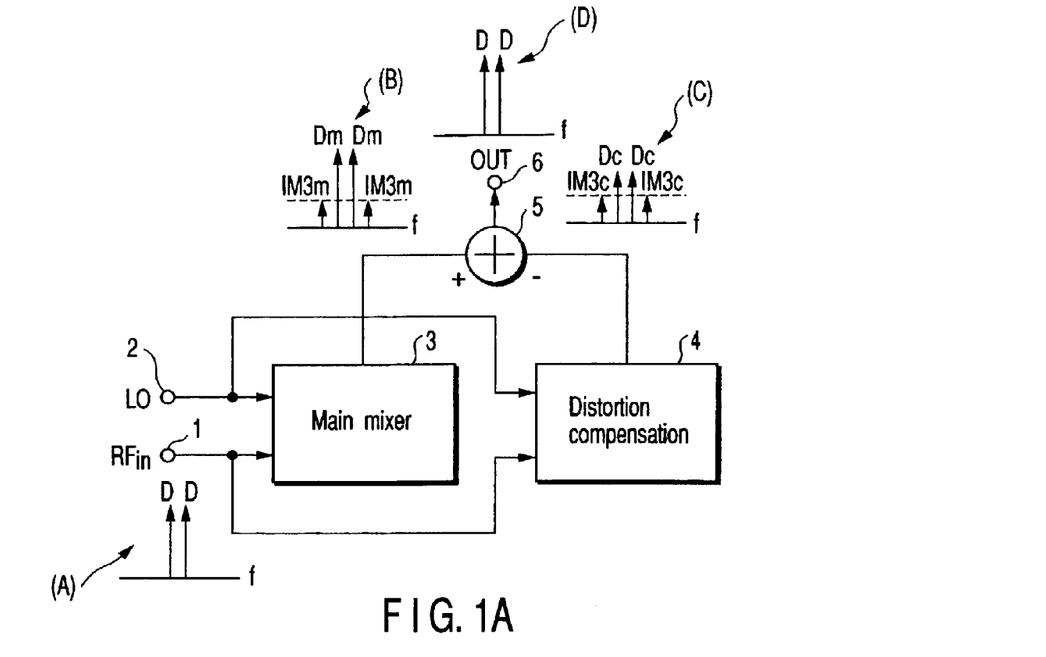
FIGS. 1A and 1B show schematic block circuits of frequency converters according to the first embodiment of the present invention.

According to the frequency converter according to the first embodiment as shown in FIG. 1A, a RF input signal is input to the first input terminal 1 as an input signal to be frequency-converted, and a local signal is input to the second input terminal 2. The RF input signal and local signal are input to a main mixer (first mixer) 3, and a distortion compensation mixer (second mixer) 4. In the main mixer 3 and distortion compensation mixer 4, the RF input signal is frequency-converted according to the local signal. In other words, the main mixer 3 and distortion compensation mixer 4 function as a multiplier which multiplies the RF input signal with the local signal.

The output signals from the main mixer 3 and distortion compensation mixer 4 are added in opposite phase to each other by an adder 5. If the output signal of the main mixer 3 is a positive phase and the output signal of the distortion compensation mixer 4 is a negative phase, the output signals of the mixers 3 and 4 are added in opposite phase by the adder 5. The adder 5 can be realized by connecting lines, for example, as described below. The output signal from the adder 5 is output as a frequency conversion output signal from an output terminal 6. The conversion gain of the distortion compensation mixer 4 is set to a value smaller than that of the main mixer 3. As a result, the relation between a desired wave output Dm from the main mixer 3 and a desired wave output Dc from the distortion compensation mixer 4 is represented as follows:

$$Dm > Dc \quad (1)$$

Furthermore, the mixers 3 and 4 are designed so that the third order distortion IM3$m$ of the output from the main mixer 3 and the third order distortion IM3$c$ of the output from the distortion compensation mixer 4 become approximately equal.

$$IM3m = IM3c \quad (2)$$

The concrete design technique that can satisfy the conditions of the equations (1) and (2) will be described in detail later.

When the adder 5 adds the output signals from the main mixer 3 and distortion compensation mixer 4 in opposite phase, the third order distortions are approximately canceled to each other. As a result, the frequency-converted output signal has a desired wave of amplitude substantially equal to that of a desired wave output from the main mixer 3.

In FIG. 1A, when a desired wave of 2 tones (D wave) (A) is input to the input terminal as a RF input signal, respective signal spectrums (A), (B), (C) and (D) are appeared on respective parts. In the signal spectrums (B) and (C) from the main mixer 3 and distortion compensation mixer 4, the third order distortions IM3 are equal to each other (IM3$m$ = IM3$c$). However, since the conversion gain of the distortion compensation mixer 4 is small than that of the main mixer 3, the D wave component of the distortion compensation mixer 4 is small than that of the mixer 3, i.e., Dm>Dc. Therefore, in the output (D) of the adder 5, the component IM3 is canceled, the output (D) approximately become only a D wave component.

For example, when the current amplitude of the desired wave output Dm from the main mixer 3 is set to 1, and the current amplitude of a desired wave output Dc from the distortion compensation mixer 4 is set to ⅓, the current amplitude of the frequency-converted output signal of the present frequency converter is attenuated by 3.5 dB as compared with the frequency converter constructed only by the main mixer 3. However, since the third order distortion IM3 theoretically is infinitesimal, the third order input conversion incept point (IIP3) increases. However, since the gain of the desired wave attenuates 3.5 dB, it is not useful to increase the current amplitude of the desired wave output Dc from the distortion compensation mixer 4 larger than ⅓, considering the requested values of the gain and noise that are main property other than the distortion.

Figure 1B:
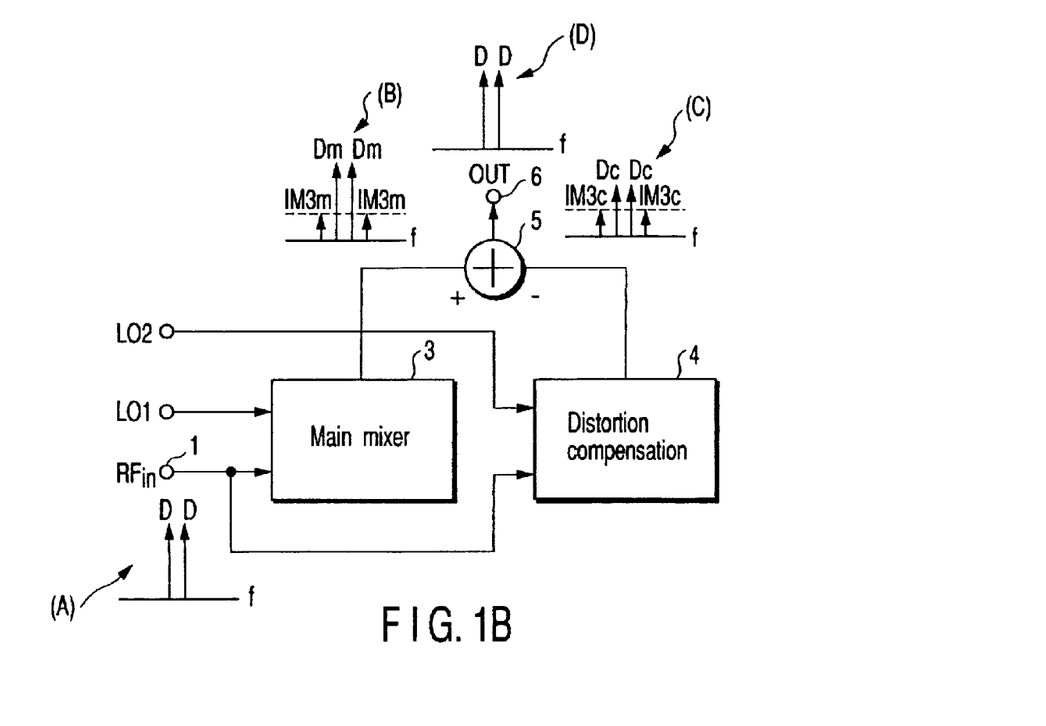

FIG. 1B shows a frequency converter wherein local signals LO1 and LO2 whose phases differ from each other are supplied to the main mixer 3 and distortion compensation mixer 4, respectively. According to this frequency converter, the output currents from the main mixer 3 and distortion compensation mixer 4 can be in opposite phase by adjusting the phase relationship between the first and second local signals LO1 and LO2.

Figure 2:
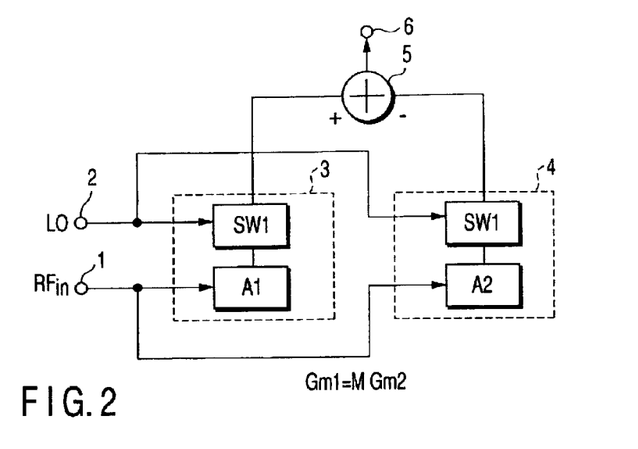
FIG. 2 shows a concrete block circuit of the frequency converter of FIG. 1A.

FIG. 2 shows more concretely the main mixer 3 and distortion compensation mixer 4 of the frequency converter of FIG. 1A. The main mixer 3 comprises a transconductance amplifier (referred to as Gm amplifier) A1 and a current switch SW1 connected to the output side thereof. The distortion compensation mixer 4 comprises a Gm amplifier A2 and a current switch SW2 connected to the output side thereof. The Gm amplifiers A1 and A2 subject the RF input signal to voltage-to-current conversion. The current switches SW1 and SW2 perform a switching operation according to a local signal LO.

If the gains of the Gm amplifiers A1 and A2 are represented by Gm1 and Gm2 respectively, the relation therebetween is expressed by the following equation based on the condition of the conversion gains for the desired waves of the main mixer 3 and distortion compensation mixer 4.

$$Gm1 = M \times Gm2 \ (M \text{ is a constant larger than 3}) \quad (3)$$

This situation is desirable. In this case, the operating current I2 flowing through the Gm amplifier A2 in the distortion compensation mixer 4 is set in relation to that operating current I1 flowing through Gm amplifier A1 in the main mixer 3 as represented by the following equation:

$$I2 = I1/L \, (L > M) \quad (4)$$
$$I1 = L \times I2 \, (L \text{ is a constant larger than } M)$$

As a result, even if the gain Gm2 of the Gm amplifier A2 is smaller than the gain Gm1 of the Gm amplifier A1, the third order distortions IM3 occurring in the Gm amplifiers A1 and A2 are approximately the same level. Therefore, adding the operating currents in opposite phase with the adder 5 can minimize the third order distortion IM3 of the frequency conversion output signal.

Figure 3A:
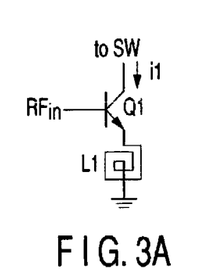
FIGS. 3A, 3B, 3C, 3D and 3E show circuit diagrams of the various kinds of transconductance amplifiers capable of applying to a main mixer and a distortion compensation mixer which construct the frequency converter according to the present invention.
Figure 3B:
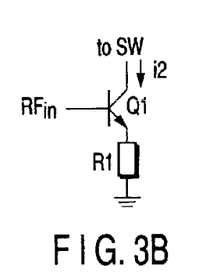
Figure 3C:
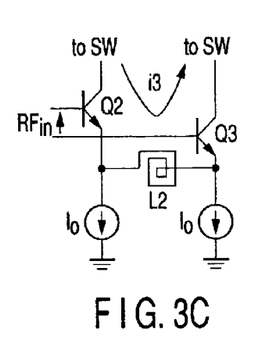
Figure 3D:
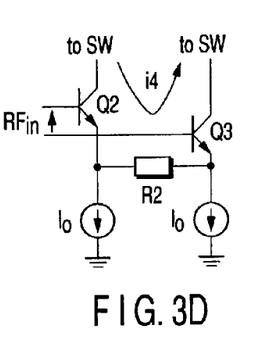
Figure 3E:
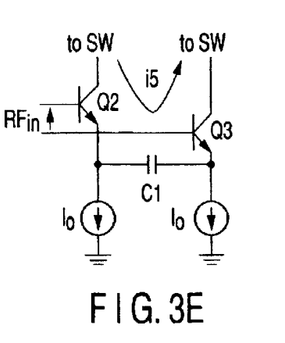

FIGS. 3A to 3E show concrete circuits of the Gm amplifier used in the main mixer 3 and distortion compensation mixer 4. FIGS. 3A and 3B show Gm amplifiers used for the frequency converter constructed in a SBM (single balance mixer) configuration, the Gm amplifier being constructed by one transistor Q1. FIGS. 3C, 3D and 3E show Gm amplifiers used for the frequency converter constructed in a DBM (double balance mixer) configuration, the Gm amplifier being fabricated by two transistors Q2 and Q3. In the configuration, the transistors Q1, Q2 and Q3 operate as common emitter transistors wherein the emitter terminal as the second main electrode is connected to a constant potential point.

Further, in the circuits shown in FIGS. 3A and 3B an impedance element is connected between the emitter terminal of the transistor Q1 and the ground. In FIGS. 3C to 3E, an impedance element is connected between the emitter terminals of the transistors Q2 and Q3. Such an element generally refers to as an emitter degeneration impedance element, but merely refer to as degeneration impedance element considering using a field effect transistor as well as a bipolar transistor in the specification.

In the circuit shown in FIG. 3A, an inductance L1 is connected between the emitter terminal (the second main electrode) of the transistor Q1 and the ground (constant potential point). This circuit has a superior property in low noise characteristic. If the voltage of the RF input signal input to the base terminal (control electrode) of the transistor Q1 is represented as Vin, the output current i1 from the collector terminal of the transistor Q1 (the first main electrode) is represented approximately by the following equation:

$$i1 = Vin/j\omega L1 \quad (5)$$

Generally, the inductance is used as an external element in IC. Recently, the inductance can be fabricated in IC. However, when the inductance is fabricated in IC, it requires a larger region in comparison with a resistor.

In FIG. 3B, a resistor R1 is connected between the emitter terminal of the transistor Q1 and the ground. In this case, if the voltage of the RF input signal input to the base terminal of the transistor Q1 is represented by Vin, the output current i2 from the collector terminal of the transistor Q1 is expressed approximately by the following equation:

$$i2 = Vin/R1 \quad (6)$$

FIG. 3C shows a Gm amplifier of a differential type wherein an inductance L2 as an emitter degeneration impedance element is connected between a differential pair of transistors Q2 and Q3 and current sources Io are connected to the emitter terminals of the transistors Q2 and Q3, respectively. When the inductance is used as an emitter degeneration impedance element, the noise characteristic is improved in comparison with a circuit using a resistor as the emitter degeneration impedance element. On the other hand, chip area increases when the inductance is fabricated in the IC. In this case, if the voltage of the RF input signal input between the base terminals of the transistors Q2 and Q3 is represented as Vin, the output current i3 is expressed approximately by the following equation:

$$i3 = Vin/j\omega L2 \quad (7)$$

FIG. 3D shows a Gm amplifier of a differential type wherein a resistor R2 as an emitter degeneration impedance element is connected between a differential pair of transistors Q2 and Q3 and current sources Io are connected to the emitter terminals of the transistors Q2 and Q3, respectively. In this case, if the voltage of the RF input signal input between the base terminals of the transistors Q2 and Q3 is represented as Vin, the output current i4 is expressed approximately by the following equation:

$$i4 = Vin/R2 \quad (8)$$

FIG. 3E shows a Gm amplifier of a differential type wherein a capacitor C1 as an emitter degeneration impedance element is connected between a differential pair of transistors Q2 and Q3 and current sources Io are connected to the emitter terminals of the transistors Q2 and Q3, respectively. In this case, if the voltage of the RF input signal input between the base terminals of the transistors Q2 and Q3 is represented as Vin, the output current i5 is expressed approximately by the following equation:

$$i5 = j\omega C1 * Vin \quad (9)$$

Figure 4:
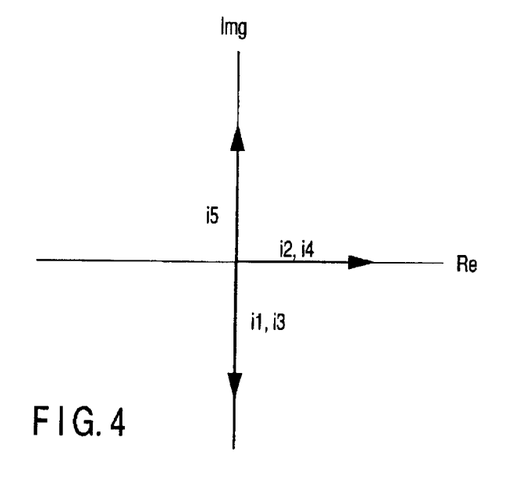
FIG. 4 shows an output current phase of each transconductance amplifier shown in FIGS. 3A to 3E.

FIG. 4 shows phases of the output currents i1, i2, i3, i4 and i5 of the Gm amplifiers shown in FIGS. 3A, 3B, 3C, 3D, and 3E. Re indicates a real axis, and Img an imaginary number axis. The output currents i2 and i4 of the Gm amplifiers using a resistor as the emitter degeneration impedance element as shown in FIGS. 3B and 3D are shown as the real number of phase 0°. Such a phase relationship is clear from equations (5) to (9). Generally this phase relationship depends about a distorted component as well as a desired wave component of the output current of the Gm amplifier.

In order to perform distortion compensation by the technique explained referring to FIGS. 1A and 2, that is, in order to cancel the third order distortion in the frequency conversion output signal by adding, in opposite phase, the output signals from the main mixer 3 and phase compensation mixer 4, the phase relationship of the output current of the Gm amplifier A1 in the main mixer 3 and the output current of the Gm amplifier A2 in the distortion compensation mixer 4 shown in FIG. 2 is limited to either of a positive phase or a negative phase. In this case, local signals supplied to the main mixer 3 and distorted compensation mixer 3 are in phase. If this phase relationship is in phase, the output currents of the Gm amplifiers A1 and A2 may be added to (or subtracted from) each other in opposite phase.

Further, if the phase relationship is in opposite phase, the third order distortion is canceled by merely adding the output currents of the Gm amplifiers A1 and A2. In other words, for purpose of making in phase the output signals of the Gm amplifiers A1 and A2, the same kinds of elements are used as the emitter degeneration impedance element. For the purpose of making the output currents in opposite phase, one of Gm amplifiers A1 and A2 may use an inductance as the emitter degeneration impedance element and the other a capacitor.

Further, considering the impedance when viewed from the emitter terminal of the transistor used for the Gm amplifier, the output current of the Gm amplifier cannot be expressed simply by the equations (5) to (9). Therefore, in order to perform desired distortion compensation according to the method explained referring to FIGS. 1A and 2, it becomes necessary to use a resistor as the emitter degeneration impedance element.

(The Second Embodiment)

The second embodiment of the present invention will be described referring to FIGS. 5 to 8. Before describing the second embodiment concretely, there will now be described a method of selecting the emitter degeneration impedance element in the Gm amplifier in the main mixer 3 and distortion compensation mixer 4 that are explained with the first embodiment.

In the frequency converter wherein the main mixer 3 and distortion compensation mixer 4 are arranged in parallel as described in the first embodiment, it is desired for realizing low noise property that an inductance is used as the emitter degeneration impedance element in the Gm amplifier A1 in the main mixer 3. In this case, it is desired for suppressing the distortion effectively that an inductance is used as the emitter degeneration impedance element in the Gm amplifier A2 in the distortion compensation mixer 4.

Considering the frequency converter of a GHz band, the inductance used as the emitter degeneration impedance element included in the Gm amplifier of the mixer often has a value of several nanohenries in terms of noise and conversion gain. In contrast, in the present embodiment, the value of the inductance used as the emitter degeneration impedance element in the Gm amplifier A2 in the distortion compensation mixer 4 requires a value larger than the value of the inductance used as the emitter degeneration impedance element in the Gm amplifier A2 in the main mixer 3, for example, several ten nanohenries, according to the condition Gm1=M×Gm2 which is shown by the equation (3) (M is a constant larger than 3), fabrication of the inductance of such a large value on an IC chip results in a large occupancy area. Therefore, it is desired to use elements other than the inductance, that is, a resistor or a capacitor as the emitter degeneration impedance element in the Gm amplifier A2 in the distortion compensation mixer 4.

However, considering the impedance when viewed from the emitter side of a transistor used for the Gm amplifier, if a resistor or a capacitor is simply used as the emitter degeneration impedance element in Gm amplifier A2, the output currents from the main mixer 3 and distortion compensation mixer 4 do not become in phase or opposite phase. As a result, a distortion cancel effect to be obtained by adding the output currents from the main mixer 3 and distortion compensation mixer 4 in opposite phase has been reduced.

Figure 5:
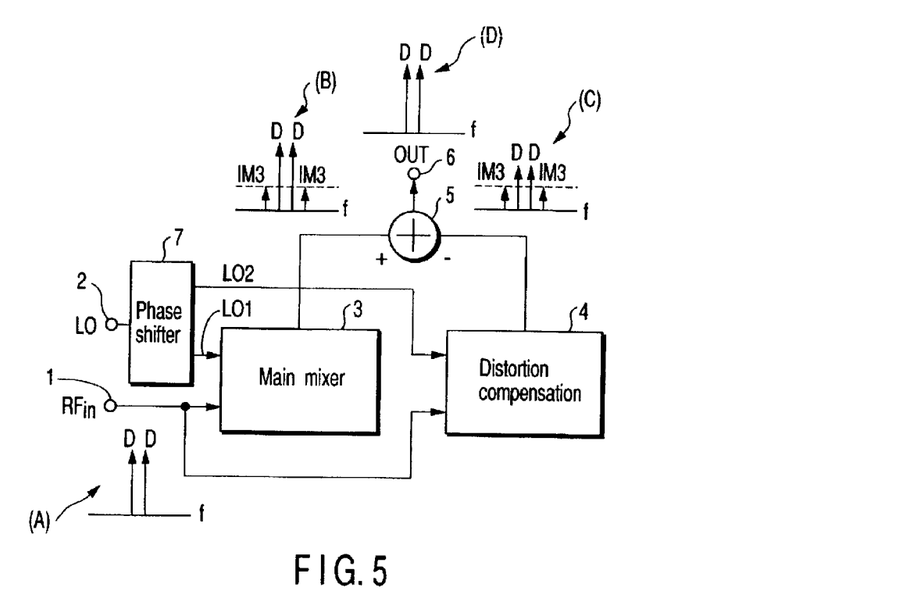
FIG. 5 shows a schematic block circuit of a frequency converter according to the second embodiment of the present invention.

FIG. 5 shows a frequency converter according to the second embodiment of the present invention that solves such a problem. This embodiment provides with a phase shifter in addition to the embodiment of FIG. 1A. In the present embodiment, a local signal (original local signal) LO from a local oscillator (not shown) is supplied to the phase shifter via the input terminal 2. As a result, the first and second local signals LO1 and LO2 that differ in phase are generated from the phase shifter 7. The first local signal LO1 is input to the main mixer 3 and the second local signal LO2 to the distortion compensation mixer 4.

According to this configuration, if the phase relationship of the first and second local signals LO1 and LO2 is adjusted, the output currents from the main mixer 3 and distortion compensation mixer 4 can have an opposite phase relation.

Figure 6:
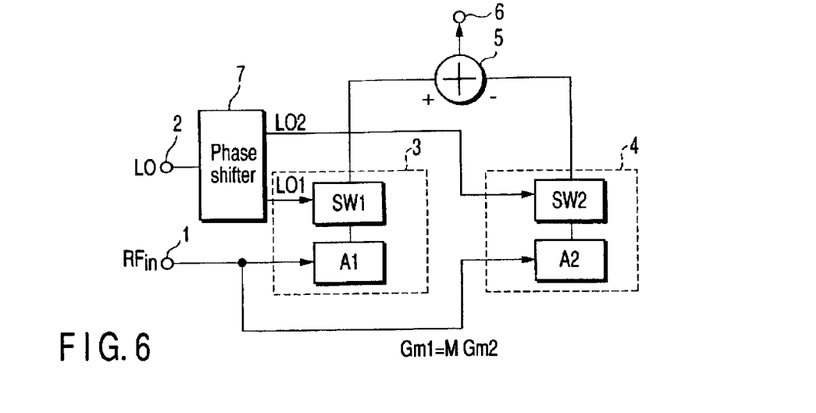
FIG. 6 shows a concrete block circuit of the frequency converter of FIG. 5.

FIG. 6 shows the frequency converter of FIG. 5 more in detail, and a phase shifter 7 is added to the embodiment of FIG. 2. The main mixer 3 comprises a Gm amplifier A1 and a current switch SW1 connected to the output side of the Gm amplifier A1, and the distortion compensation mixer 4 comprises a Gm amplifier A2 and a current switch SW2 connected to the output side of the Gm amplifier A2. The Gm amplifiers A1 and A2 subject the RF input signal to voltage-to-current conversion.

In the present embodiment, the current switches SW1 and SW2 are switched by the first and second local signals LO1 and LO2 obtained by supplying the original local signal LO to the phase shifter 7, respectively. Furthermore, the gains Gm1 and Gm2 of the Gm amplifiers A1 and A2 are set so as to satisfy the condition of Gm1=M×Gm2 shown in the equation (3) (M is a constant larger than 3) according to the condition of the conversion gains relative to the desired waves of the main mixer 3 and distortion compensation mixer 4.

Figure 7:
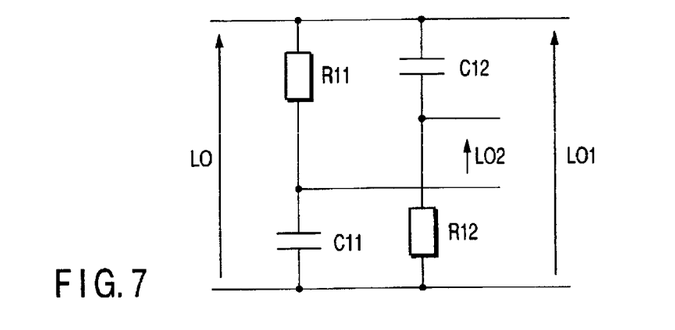
FIG. 7 shows a circuit of a phase shifter capable of applying to the frequency converter according to the second embodiment.

FIG. 7 shows a concrete circuit example of the phase shifter 7 of the present embodiment. This phase shifter comprises a bridge circuit including two resistors R11 and R12 arranged on opposite two sides and two capacitors C11 and C12 arranged on opposite other two sides. A series circuit of the resistor R11 and capacitor C11 constructs an integrator, and a series circuit of the capacitor C12 and resistor R12 constructs a differentiator. The series circuits are connected in parallel. The original local signal LO is input to both ends of the bridge circuit, that is, both ends of the integrator and differentiator. The first local signal LO1 is extracted from the original local signal LO at it is, and the second local signal LO2 is extracted as difference of the outputs of the integrator and differentiator from between a node of R11 and C11 and a node of R12 and C12 in the bridge circuit.

Figure 8A:
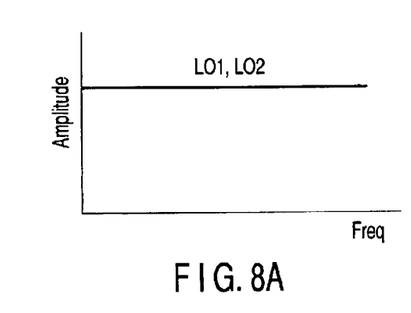
FIGS. 8A and 8B show frequency characteristics of the amplitude and phase of the phase shifter of FIG. 7.
Figure 8B:
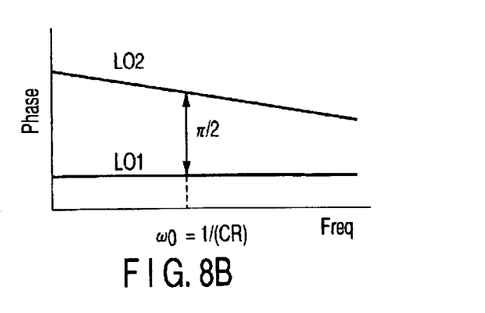

The frequency characteristics of the amplitude and phase of the first and second local signals LO1 and LO2 generated by the phase shifter 7 of FIG. 7 are shown in FIGS. 8A and 8B. As shown in FIG. 8A, the amplitude-frequency characteristics of the local signals LO1 and LO2 are flat together. On the other hand, as shown in FIG. 8B, the phase-frequency characteristic of the local signal LO1 is flat, whereas the local signal LO2 decreases in phase on the high frequency range. If the resistors R11 and R12 have substantially the same value R, and the capacitors C11 and C12 have substantially the same value C, the phase shift quantity of the local signal LO2 (phase difference between the local signals LO1 and LO2) is $\pi/2$ in angular frequency $\omega o=\frac{1}{2}(CR)$.

As thus described, according to the present embodiment, the first and second local signals LO1 and LO2 that differ in phase from each other are generated from the original local signal LO input to the input terminal 2 by the phase shifter 7. The first and second local signals LO1 and LO2 are supplied to the main mixer 3 and distortion compensation mixer 4, respectively. Therefore, by adjusting the phase relationship of the local signals LO1 and LO2 by means of the phase shifter 7, the phase relationship of the output currents from the main mixer 3 and distortion compensation mixer 4 can be in an opposite relation, and the distortion can be reliably reduced by adding the output currents from the main mixer 3 and distortion compensation mixer 4 in opposite phase by means of the adder 5.

(The Third Embodiment)

Figure 9:
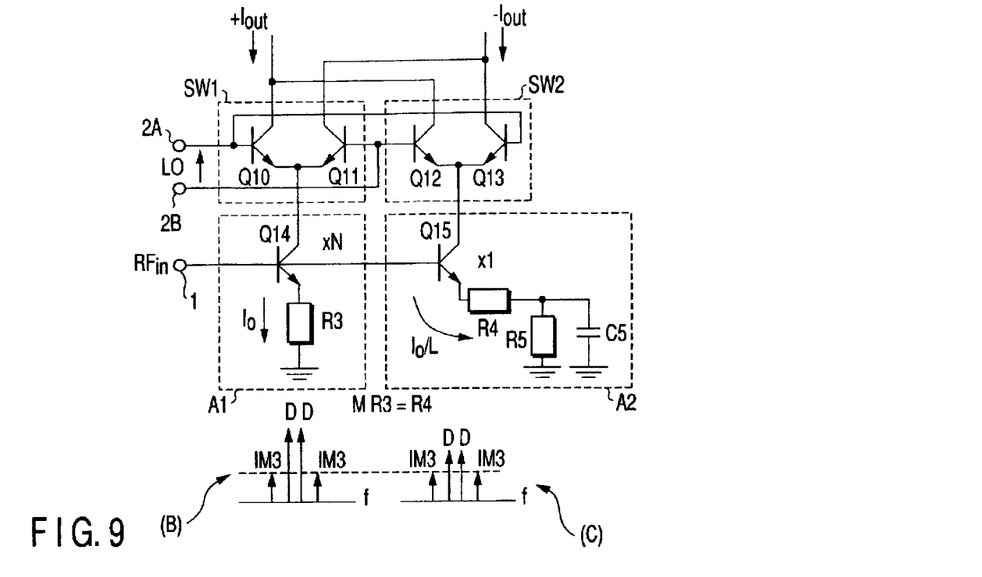
FIG. 9 shows a configuration of a frequency converter according to the third embodiment of the present invention, which constructs more concretely the frequency converter of FIG. 2.

FIG. 9 shows a frequency converter according to the third embodiment of the present invention. According to this frequency converter, the emitter degeneration impedance elements included in the Gm amplifiers A1 and A2 in the main mixer 3 and distortion compensation mixer 4 are constructed by the same kinds of elements (resistors in this embodiment), and the mixers 3 and 4 are constructed in a SBM configuration.

The main mixer 3 comprises a current switch SW1 including a differential pair of transistors Q10 and Q11, and a Gm amplifier A1 including a transistor Q14 and an emitter degeneration resistor R3. The distortion compensation mixer 4 comprises a current switch SW2 including a differential pair of transistors Q12 and Q13 and a Gm amplifier A2 including a transistor Q15 and an emitter degeneration resistor R4. The emitter terminal of the transistor Q15 is connected to a resistor R5 and a capacitor C5 via an emitter degeneration resistor R4 in series. It is assumed that the connecting point of R5, C5 and R4 is grounded in RF frequency in alternating current mode.

In the present embodiment, the outputs of the main mixer 3 and distortion compensation mixer 4 are added to (or subtracted from) each other in opposite phase. For the purpose of inversing the polarity of differential output currents of the main mixer 3 and distortion compensation mixer 4, the collector terminals of the transistor Q10 and Q12 are connected to each other, the collector terminals of the transistors Q11 and Q13 are connected to each other, the base terminals of the transistors Q10 and Q13 are connected to each other, and the base terminals of the transistors Q11 and Q12 are connected to each other. In other words, the adder 5 of the first embodiment is realized by connection of the current switches SW1 and SW2.

The base terminal of the transistor Q14 in the Gm amplifier A1 and the base terminal of the transistor Q15 in the Gm amplifier A2 are connected in common to the first input terminal 1 to which the RF input signal is input. On the other hand, in the current switches SW1 and SW2, the base terminals of the transistors Q10 and Q13 are connected in common to the second input terminal 2A to which the positive signal of the differential local signal is input. The base terminals of the transistors Q11 and Q12 are connected in common to the other second input terminal 2B to which the negative signal of the differential local signal is input.

The current flowing through the transistor Q14 is determined by the emitter dc potential of the transistor Q14 and the value of the resistor R3. If the current is Io, the current flowing through the transistor Q15 is determined by the values of the resistors R4 and R5 and the base potential of the transistor Q15. The current is Io/L (L is a constant).

If the transconductances of the Gm amplifiers A1 and A2 are defined by Gm1 and Gm2, R4=M×R3 is set to satisfy condition of the equation (3) of Gm1=M×Gm2 (M is a constant larger than 3). M may be a constant which is larger than 1 essentially. However, when the conversion gain of the distortion compensation mixer 4 is set larger than ⅓ in comparison with the conversion gain of the main mixer 3 as described heretofore, the entire gain of the frequency converter is decreased by 3.5 dB, to be not practical. Therefore, it is expected that M is a value more than 3.

It is preferable for making the density of the current flowing through the transistor constant that the dimension ratio of transistors Q14 and Q15 is set to L by 1, and the dimension ratio of the transistors Q10 and Q11 and the transistors Q12 and Q13 is set to L:1 preferably. However, since L:1 is no indispensable condition, N:1 is defined in FIG. 9.

The constant M is a ratio between transconductances Gm1 and Gm2 of the Gm amplifiers A1 and A2 or a ratio between the resistors R4 and R3, and the constant L is a ratio between the resistor R3 and the serial combined resistance of the resistors R4 and R5. Since L>M, and the ratio between currents flowing through the Gm amplifiers A1 and A2 is larger than the ratio between transconductances Gm1 and Gm2 of the Gm amplifier A1 and A2, the Gm amplifier A2 is easy to come to produce distortion in comparison with the Gm amplifier A1.

If the constants L and M are set to suitable values (for example, L=15, M=6) in these conditions, the third order distortions (IM3) of the Gm amplifiers A1 and A2 can be set to substantially the same level. The spectrums of desired wave output D and third order distortion IM3 of the main mixer 3 and distortion compensation mixer 4 are shown by (B) and (C) in FIG. 9.

In the main mixer 3 and distortion compensation mixer 4, the emitter degeneration impedance elements are formed of the same kind of elements, that is, resistors R3, R4 and R5. For this reason, the phases of the third order distortions IM3 occurring in the mixers 3 and 4 as shown by (B) and (C) in FIG. 9 are approximately the same, and the amplitudes are approximately equal. Therefore, the third order distortion IM3 is suppressed by adding the output currents of the mixers 3 and 4 in opposite phase. Even if the emitter degeneration resistors R3, R4 and R5 of the main mixer 3 and distortion compensation mixer 4 are substituted with inductances, the distortion suppression effect is obtained. Further, even if the resistors R3 and R4 are substituted with inductances, the resistor R5 may be a resistor for deciding a current.

(The Fourth Embodiment)

Figure 10:
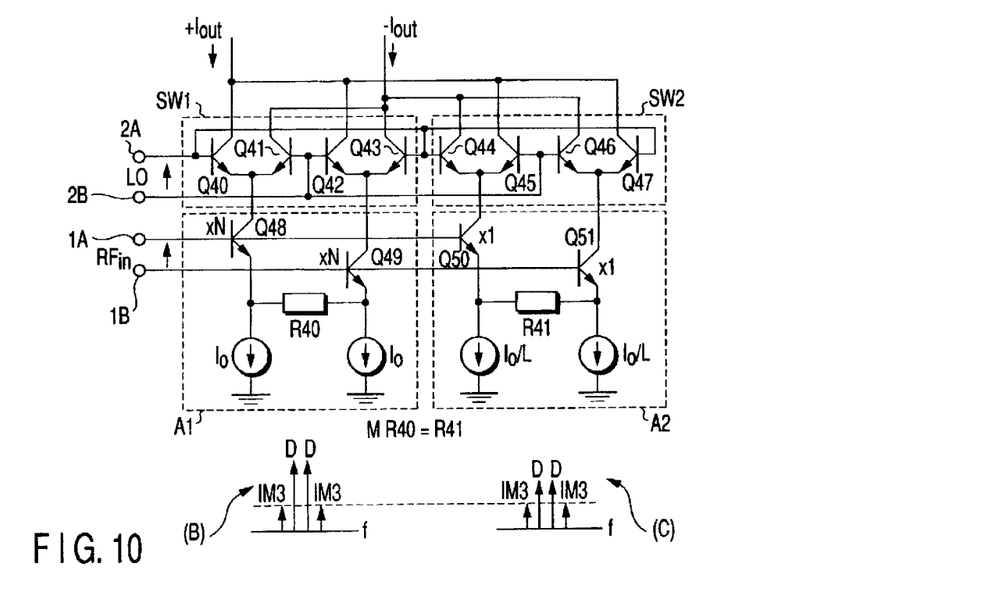
FIG. 10 shows a configuration of a frequency converter according to the fourth embodiment of the present invention, which corresponds to a differential construction of the frequency converter shown in FIG. 9.

FIG. 10 shows a frequency converter of the fourth embodiment of the present invention, which reconstructs the frequency converter shown in FIG. 9 in a differential configuration. In the frequency converter of FIG. 10, the emitter degeneration impedance elements of the Gm amplifiers A1 and A2 in the main mixer 3 and distortion compensation mixer 4 are made up of the same kind of elements (resistors in this embodiment), and the main mixer 3 and distortion compensation mixer 4 are constructed in a DBM configuration.

The main mixer 3 comprises a current switch SW1 fabricated by two sets of a differential pair of transistors Q40 and Q41 and a differential pair of transistors Q42 and Q43, and a Gm amplifier A1 fabricated by transistors Q48 and Q49 and an emitter degeneration resistor R40 connected between the emitter terminals of the transistor Q48 and 49. The distortion compensation mixer 3 comprises a current switch SW2 fabricated by two sets of a differential pair of transistors Q44 and Q45 and a differential pair of transistors Q46 and Q47, and a Gm amplifier A2 fabricated by transistors Q50 and Q51 and an emitter degeneration resistor R40 connected between the emitter terminals of the transistor Q48 and 49.

In the present embodiment, the output current of the main mixer 3 and output current of the distortion compensation mixer 4 are added to (subtracted from) each other in opposite phase similarly to the third embodiment. In order to make the polarities of the differential output currents of the main mixer 3 and distortion compensation mixer 4 into a reversal relation, the collector terminals of the transistors Q40 and Q42 are connected to the collector terminals of the transistors Q45 and Q47, and the collector terminal of transistors Q41 and Q43 are connected to the collector terminals of the transistors Q44 and Q46. Further, the base terminals of the transistors Q40 and Q43 are connected to the base terminals of the transistor Q44 and Q47, and the base terminals of the transistors Q41 and Q42 are connected to the base terminals of the transistor Q45 and Q46.

In the present embodiment, the adder 5 is realized by connecting the current switches SW1 and SW2 to each other. The base terminal of the transistor Q48 in the Gm amplifier A1 and the base terminal of the transistor Q50 in the Gm amplifier A2 are connected in common to the first input terminal 1A for inputting the positive signal of the differential RF input signal, and the base terminal of the transistor Q49 in the Gm amplifier A1 and the base terminal of the transistor Q51 in the Gm amplifier A2 are connected in common to the other first input terminal 1A for inputting the negative signal of the differential RF input signal. On the other hand, in the current switches SW1 and SW2, the base terminals of the transistors Q40, Q43, Q44 and Q47 are connected in common to the second input terminal 2A for inputting the positive signal of the differential local signal, the base terminals of the transistors Q41, Q42, Q45 and Q46 are connected in common to the other second input terminal 2B for inputting the negative signal of the differential local signal.

If the current flowing through the transistors Q48 and Q49 is Io, the current flowing through the transistors Q50 and Q51 are set to Io/L. When the transconductances of the Gm amplifiers A1 and A2 are defined as Gm1 and Gm2, R41=M×R40 is set to satisfy the condition of the equation (3) of Gm1=M×Gm2 (M is a constant larger than 3). M may be a constant which is larger than 1 essentially. However, when the conversion gain of the distortion compensation mixer 4 is set to a value larger than ⅓ in comparison with the conversion gain of the main mixer 3 as described heretofore, the entire gain of the frequency converter is decreased by 3.5 dB, to be not practical. Therefore, it is expected that M is a value more than 3.

It is preferable for making the density of the current flowing through the transistor constant that the dimension ratio of transistors Q48 and Q49 and transistors Q50 and Q51 is set to L:1 preferably, and the dimension ratio L between the transistors Q40, Q41, Q42 and Q43 and the transistors Q44, Q45, Q46 and Q47 is set to 1 preferably. However, since L:1 is no indispensable condition, N:1 is defined in FIG. 10.

Furthermore, L is set so that the relations between the constants M and L become L>M in the present embodiment similar to the third embodiment, but substantially the same level can set to the third order distortions (IM3) of the Gm amplifiers A1 and A2 by setting L and M to a suitable value (for example, L=15, M=6). In this time, the spectrums of the desired wave output D and third order distortion IM3 of the main mixer 3 and distortion compensation mixer 4 are shown by (B) and (C) in FIG. 10.

In the main mixer 3 and distortion compensation mixer 4, the emitter degeneration impedance elements comprises the same kind of elements, that is, resistors R40 and R41. For this reason, the phases of distortions IM3 occurring in the main mixer 3 and distortion compensation mixer 4, respectively, are approximately the same, and the amplitudes thereof are approximately equal as shown by (B) and (C) in FIG. 10. Therefore, the distortions IM3 are suppressed by adding the output currents of the main mixer 3 and distortion compensation mixer 4 in opposite phase. It is clear that a distortion suppression effect is provided even if the emitter degeneration resistors R40 and R41 in the main mixer 3 and distortion compensation mixer 4 are substituted with inductances or capacitors.

(The Fifth Embodiment)

There will now be described a frequency converter using different kinds of elements as the emitter degeneration impedance elements contained in the Gm amplifiers A1 and A2 in the main mixer 3 and distortion compensation mixer 4.

Figure 11:
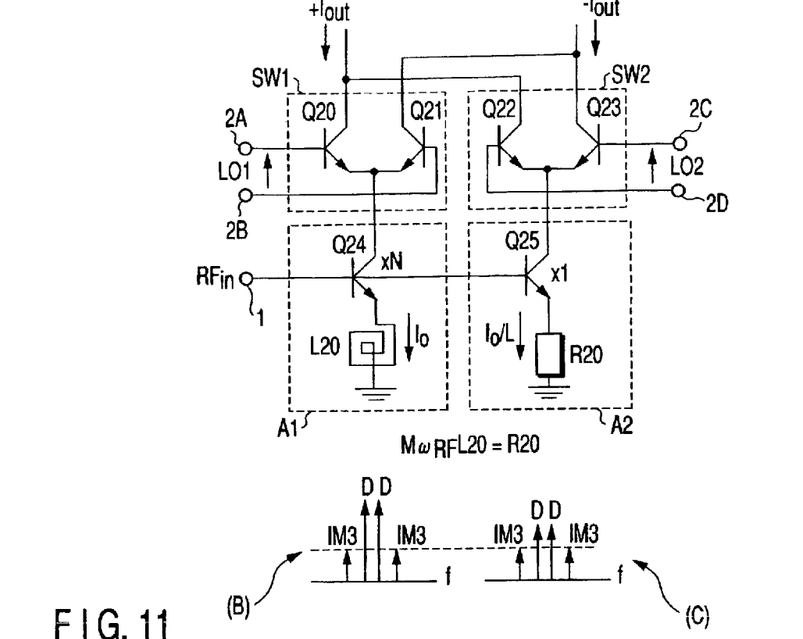
FIG. 11 shows a configuration of a frequency converter according to the fifth embodiment of the present invention, which is a modification of the frequency converter shown in FIG. 9.

FIG. 11 shows a frequency converter according to the fifth embodiment, wherein the emitter degeneration resistor R3 in the Gm amplifier A1 of the main mixer 3 in the frequency converter of FIG. 9 is substituted with inductance L20 and the emitter degeneration resistors R4 and R5 and capacitor C5 in the Gm amplifier A2 of the distortion compensation mixer 4 thereof are substituted with resistors R20. The transistors Q20, Q21, Q22, Q23, Q24, and Q25 in FIG. 11 correspond to the transistors Q10, Q11, Q12, Q13, Q14, and Q15 in FIG. 9, respectively.

In the present embodiment, the base terminals of a differential pair of transistors Q20 and Q21 constructing a current switch SW1 are connected respectively to input terminals 2A and 2B to which a first local signal LO1 is input, and the base terminals of a differential pair of transistors Q22 and Q23 constructing a current switch SW2 are connected respectively to input terminals 2C and 2D to which a second local signal LO2 is input.

R20=M×$\omega_{RF}$×L20 is set so that the transconductances Gm1 and Gm2 of the Gm amplifiers A1 and A2 satisfy the condition of the equation (3) of Gm1=M×Gm2 (M is a constant larger than 3), where $\omega_{RF}$ indicates an angular frequency of RF input signal. In this case, M may be a constant which is larger than 1 essentially. However, when the conversion gain of the distortion compensation mixer 4 is larger than ⅓ in comparison with the conversion gain of the main mixer 3, the entire gain of the frequency converter is decreased by 3.5 dB so that the frequency converter is not practical. For this reason, M is expected to be more than 3.

Further, if the current flowing through the transistor Q24 is Io, the current flowing through the transistor Q25 becomes Io/L. Furthermore, since the density of the current flowing through the transistors is constant, the dimension ratio between the transistors Q24 and Q25 is L:1, and similarly the dimension ratio between the transistors Q20 and Q21 and the transistors Q22 and Q23 is L:1. However, L:1 is not an indispensable condition, so that N:1 is defined in FIG. 11. The constant L is approximate to a ratio between the parasitic resistance of the inductance L20 and the resistor R20. L>M is made generally. Therefore, considering the point that the ratio between the currents flowing through the Gm amplifiers A1 and A2 becomes larger than the ratio between the transconductances Gm1 and Gm2 of the Gm amplifiers A1 and A2 Gm amplifier A2, resulting in that the Gm amplifier A2 is easy to produce distortion in comparison with the Gm amplifier A1 as described in the fourth embodiment, the third order distortions (IM3) of the Gm amplifiers A1 and A2 can be set to substantially the same level by designing the constants L and M in a suitable value (for example, L=15, M=6). The spectrums of the desired wave output D and third order distortion IM3 of the main mixer 3 and distortion compensation mixer 4 in this time are shown by (B) and (C) in FIG. 11.

In the present embodiment, the kind of the emitter degeneration impedance elements differs between the main mixer 3 and distortion compensation mixer 4. However, the amplitudes of the distortions IM3 becomes approximately equal as shown by (B) and (C) in FIG. 11 by setting the inductance L20 and resistor R20 to a suitable value regardless of the kind. However, the phases of desired wave outputs D and distortions IM3 which occur in the mixers 3 and 4 have the phase difference of 90° as indicated in FIG. 4. Therefore, if the first and the second local signal LO1 and LO2 are in phase, the output currents of the main mixer 3 and distortion compensation mixer 4 are not added in opposite phase, resulting in that a suppression effect of IM3 becomes small. For this reason, it is desirable for obtaining a large distortion suppression effect to set the phase difference between the first and second local signals LO1 and LO2 to 90°.

(The Sixth Embodiment)

Figure 12:
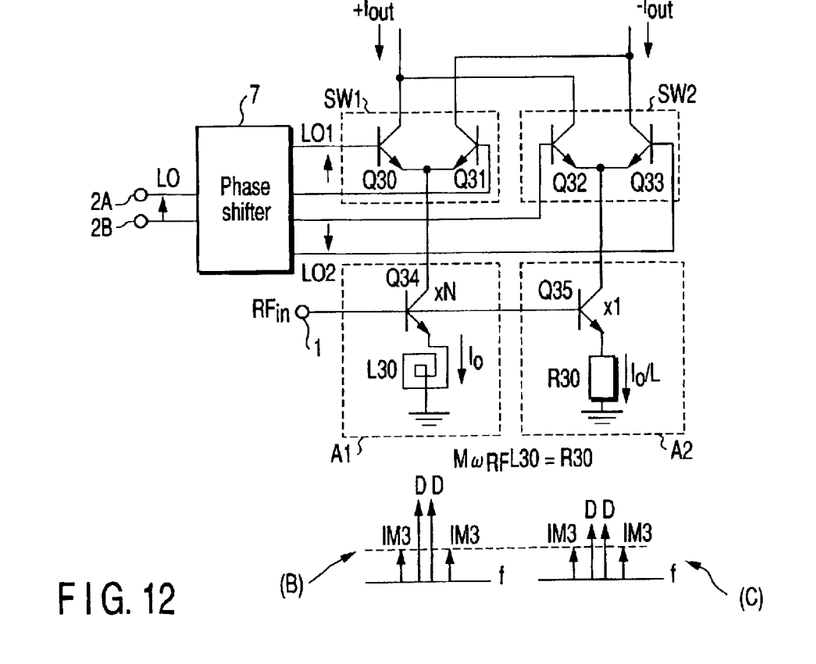
FIG. 12 shows a configuration of a frequency converter according to the sixth embodiment of the present invention, which constructs more concretely the frequency converter shown in FIG. 6.

FIG. 12 shows a concrete frequency converter of the frequency converter of FIG. 6 as the sixth embodiment of the present invention. The frequency converter of FIG. 12 has a configuration in which a phase shifter 7 that phase-shifts the local signal is added to the frequency converter of FIG. 11. The phase shifter 7 uses the circuit shown in FIG. 7, for example. The Local signals LO1 and LO2 of FIG. 12 correspond to the local signals LO1 and LO2 of FIG. 7.

Further the transistors Q30, Q31, Q32, Q33, Q34 and Q35, inductance L30 and resistor R30 in FIG. 12 correspond to the transistors Q20, Q21, Q22, Q23, Q24 and Q25, inductance L20 and resistor R20 in FIG. 11. The operation of other circuits in the present embodiment omits description because it is similar to FIG. 11. The phase shifter 7 shifts the local signal by 90° according to $\omega o=1/(RC)$, but it can increase or decrease a phase shift amount than 90° by changing the operating frequency. For this reason, even if the phase difference between the current outputs of the Gm amplifiers of the main mixer 3 and distortion compensation mixer 4 is other than 90°, the distortion is compensated by supplying the local signals LO1 and LO2 to the main mixer and distortion compensation mixer 4 via the phase shifter 7 shown in FIG. 7.

It is described in the above explanation that the phase of the current outputs of the Gm amplifiers A1 and A2 in the main mixer 3 and distortion compensation mixer 4 is determined only by elements used as the emitter degeneration impedance element. However, there is a case that the phase relationship of the output currents i1, i2, i3, i4 and i5 that is shown in FIG. 4 is not realized, because the phase depends upon the parasitic impedance of the transistor. In this case, the suppression effect of distortion reduces in the phase shifter 7 constructed by a correct 90° phase shifter. Therefore, the phase shifter 7 is preferably designed according to the phase difference between the current outputs of the Gm amplifiers A1 and A2 by selecting the values of R and C.

Figure 13:
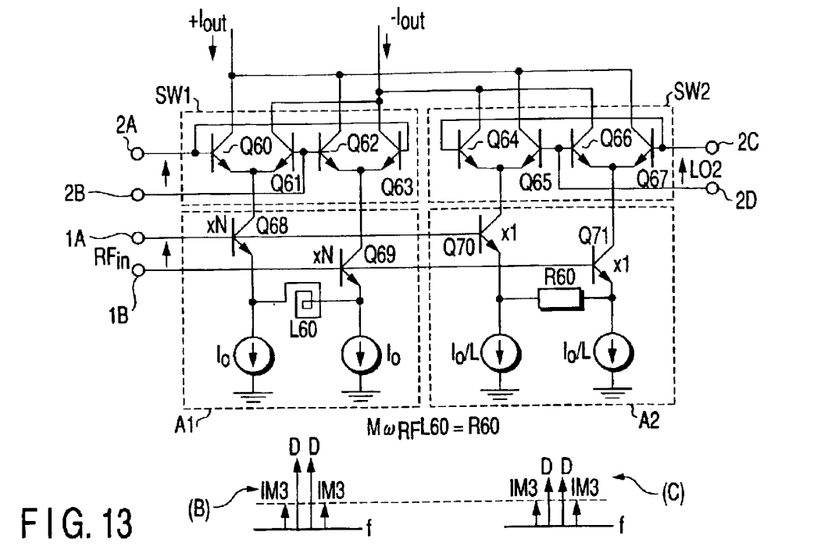
FIG. 13 shows a configuration of a frequency converter according to the seventh embodiment of the present invention, which corresponds to a differential construction of the frequency converter shown in FIG. 11.

FIG. 13 shows a frequency converter according to the seventh embodiment of the present invention which is constructed by modifying the frequency converter of FIG. 11 in a differential configuration. According to this, the emitter degeneration resistor R40 in the Gm amplifier A1 in the main mixer 3 of the frequency converter shown in FIG. 10 is substituted with an inductance L60. Transistors Q60, Q61, Q62, Q63, Q64, Q65, Q67, Q68, Q69, Q70, and Q71 in FIG. 13 correspond to the transistors Q40, Q41, Q42, Q43, Q44, Q45, Q46, Q47, Q48, Q49, Q50, and Q51 in FIG. 10. Further, an emitter degeneration resistor R60 corresponds to the emitter degeneration resistor R41 in FIG. 10.

In the present embodiment, the base terminals of the transistors Q60 and Q63 of the current switch SW1 and the base terminal of the transistors Q61 and Q62 thereof are connected to the input terminals 2A and 2B to which the first local signal LO1 is input, respectively. The base terminals of the transistors Q64 and Q67 of the current switch SW2 and the base terminals of the transistors Q65 and Q66 thereof are connected to the input terminals 2C and 2D to which the second local signal LO2 is input, respectively.

The operation of the frequency converter of the present embodiment is the same as FIG. 10 except for the point where the phase difference between the desired wave and third order distortion of the output of the main mixer 3 and the desired wave and third order distortion of the output of the distortion compensation mixer 4 is 90° as shown in FIG. 13. In order to obtain the large distortion suppression effect by making the phase difference of the desired wave and third order distortion in opposite phase in the outputs of the mixers 3 and 4, the phase difference between the second local signals LO1 and LO2 is preferably to be set to 90°.

(The Eighth Embodiment)

Figure 14A:
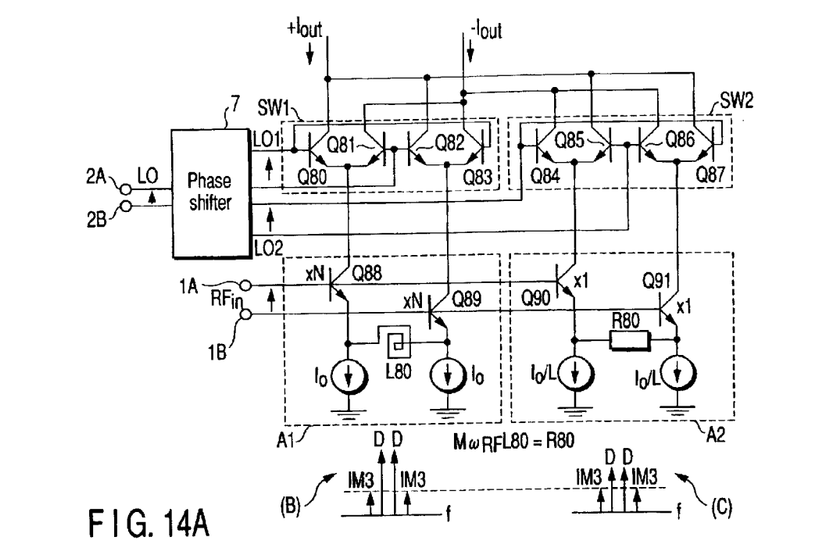
FIGS. 14A and 14B show circuit diagrams of frequency converters according to the eighth embodiment of the present invention, which constructs more concretely the frequency converter shown in FIG. 6.

FIG. 14A shows a frequency converter according to the eighth embodiment of the present invention, which concretely realizes the frequency converter shown in FIG. 6. The frequency converter of FIG. 14A has a configuration wherein the phase shifter 7 for the local signal is added to the frequency converter of FIG. 13. The phase shifter 7 has a circuit construction shown in FIG. 7, for example. The local signals LO1 and LO2 in FIG. 14A correspond to the local signals LO1 and LO2 in FIG. 7. Further, transistors Q80, Q81, Q82, Q83, Q84, Q85, Q86, Q87, Q88, Q89, Q90, and Q91, an inductance L80 and a resistor R80 in FIG. 14A correspond to the transistors Q60, Q61, Q62, Q63, Q64, Q65, Q66, Q67, Q68, Q69, Q70, Q71, an inductance L60 and a resistor R60 in FIG. 13.

In the present embodiment, $R80=M\times\omega RF\times L80$ (where $\omega RF$ indicates an angular frequency of the RF input signal) is set so that the transconductance Gm1 and Gm2 of the Gm amplifiers A1 and A2 satisfy condition of the equation (3) of $Gm1=M\times Gm2$ (M is a constant larger than 3). In this case, M may be a constant which is larger than 1 essentially. However, when the conversion gain of the distortion compensation mixer 4 is larger than ⅓ in comparison with the conversion gain of the main mixer 3, the entire gain of the frequency converter is decreased by 3.5 dB so that the frequency converter is not practical. For this reason, M is expected to be more than 3.

Further, if the currents flowing through the transistors Q88 and Q89 are Io, the currents flowing through the transistors Q90 and Q91 become Io/L. Furthermore, for the purpose of making the density of the current flowing through the transistors constant, the dimension ratio between the transistors Q88 and Q89 and the transistors Q90 and Q91 is L:1, and similarly the dimension ratio between the transistors Q80, Q81, Q82 and Q83 and the transistors Q84, Q85, Q86 and Q87 is L:1. However, L:1 is not an indispensable condition, so that N:1 is defined in FIG. 14A. Furthermore, L is set so that the relation between the constants M and L becomes L>M in the present embodiment. However, the third order distortions (IM3) of the Gm amplifiers A1 and A2 can set to substantially the same level by designing L and M in a suitable value (for example, L=15, M=6). The spectrums of the desired wave output D and third order distortion IM3 of the main mixer 3 and distortion compensation mixer 4 in this time are shown by (B) and (C) in FIG. 14A.

The emitter degeneration impedance element is the inductance L80 in the Gm amplifier A1 in the main mixer 3, and the resistor R80 in the Gm amplifier A2 in the distortion compensation mixer 4. Therefore, the phase difference between the distortions IM3 occurring in the mixers 3 and 4 is 90° and the amplitudes become approximately equal to each other as shown by (B) and (C) in FIG. 14A. Therefore, the output currents of the mixers 3 and 4 are added to each other in opposite phase by setting the phase difference between the first local signal LO1 input to the main mixer 3 and the second local signal LO2 input to the distortion compensation mixer 4 to 90°. As a result, the distortion IM3 is suppressed.

Further, the output currents of the Gm amplifiers A1 and A2 in the main mixer 3 and distortion compensation mixer 4 do not indicate often the phase relationship of the output currents i1, i2, i3, i4, and i5 that is shown in FIG. 4, due to the parasitic impedance of the transistor. In this case, the distortion suppression effect reduces if the phase shifter 7 comprises a correct 90° phase shifter. Therefore, if the phase shifter is preferably designed according to the phase difference between the current outputs of the Gm amplifiers A1 and A2 by selecting values of R and C similarly to the embodiment of FIG. 12.

Figure 14B:
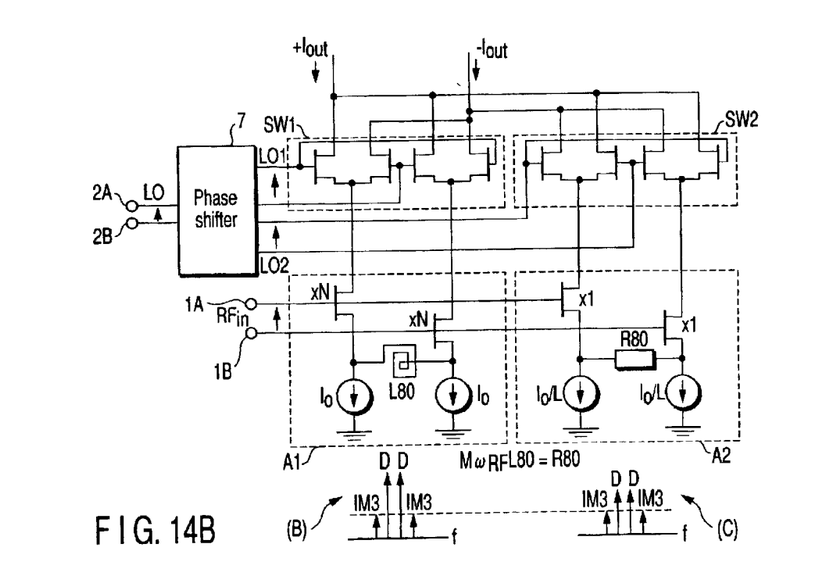

FIG. 14B shows a frequency converter wherein the bipolar transistors constructing the frequency converter shown in FIG. 14A are substituted with field effect transistors. The frequency converter of FIG. 14B performs substantially the same operation as the frequency converter of FIG. 14A and provides the same effect substantially.

(The Ninth Embodiment)

Figure 15:
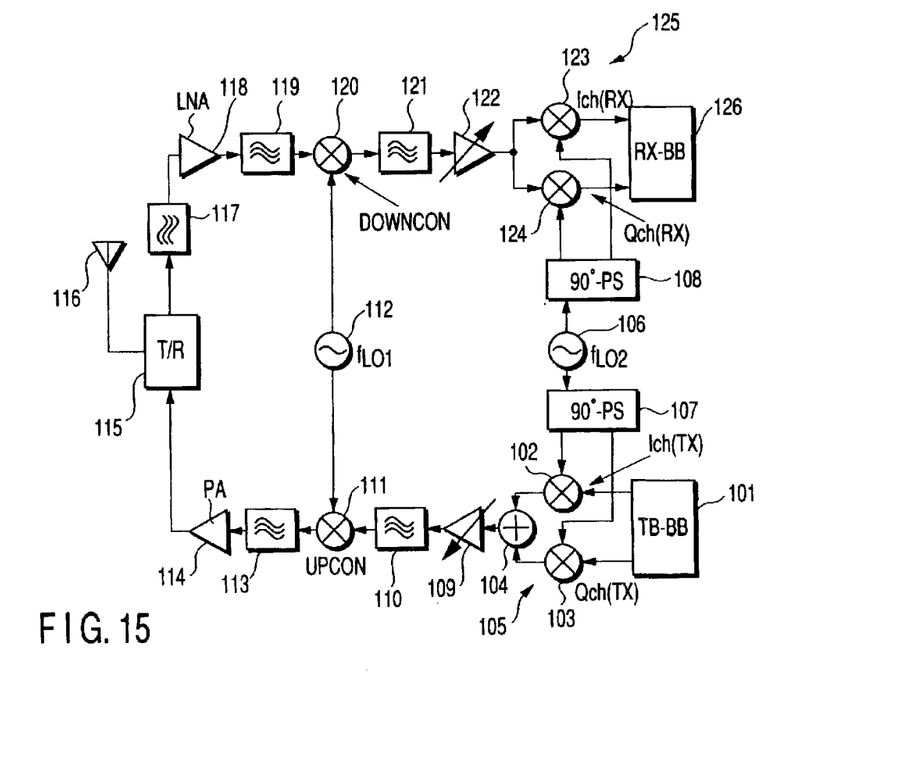
FIG. 15 shows a configuration of a radio unit of a radio communication apparatus according to the ninth embodiment of the present invention, to which the frequency converter according to the above embodiments of the present invention is applied.

The frequency converter according to the above embodiments is suitable for a mobile radio communication apparatus such as portable telephone and other communication equipment. FIG. 15 shows a configuration of a transceiver of such a radio communication apparatus. The present embodiment will be described based on TDD (Time Division Duplex) method to perform exchange between transmitting and receiving in time sharing. However, the embodiment is not limited to the TTD method.

At first the transmitter is described. The baseband signal generator (TX-BB) 101 outputs orthogonal first and second transmission baseband signals Ich(TX) and Qch(TX) subjected to band limiting by an adequate filter. These orthogonal transmission baseband signals Ich(TX) and Qch(TX) are input to an orthogonal modulator 105 constructed by two multipliers 102 and 103 and an adder 104, to modulate the second local signals of two orthogonal frequencies fLO2. The second local signals are generated by dividing a signal occurred by a local oscillator 106 by a 90° phase shifter (90°-PS) 107, and input to the orthogonal modulator 105. The modulated signal output by the orthogonal modulator 105 is an IF (Intermediate Frequency) signal, and input to a variable gain amplifier 109. The variable gain amplifier 109 regulates the input IF signal to a suitable signal level according to the gain control signal from the control system.

The IF signal output from the variable gain amplifier 109 includes unnecessary harmonic components occurred by the orthogonal modulator 105 and variable gain amplifier 109, so that the IF signal is input to an up converter 111 via a lowpass filter or a bandpass filter 110 to remove the unnecessary components. The up converter 111 performs frequency conversion (up conversion) by multiplying the IF signal with the first local signal of frequency fLO1 generated by the first local oscillator 112, and generates a RF signal of frequency fLO1+fLO2 and a RF signal of frequency fLO1−fLO2. One of two RF signals is a desired wave output, and the other is an unnecessary image signal. The RF signal of frequency fLO1+fLO2 is a desired wave output in this embodiment, but the RF signal of frequency fLO1−fLO2 may be a desired wave output.

The image signal is removed by an image removal filter 113. The desired wave output extracted from the up converter 111 via the image removal filter 113 is amplified to a desired power level by a power amplifier (PA) 114. Thereafter, the desired wave output is supplied to a radio antenna 116 via a transmitter/receiver switch (T/R) 115, and is emitted as a radio wave. On the other hand, in a receiver, the received RF signal from the antenna 116 is input to a low-noise amplifier (LNA) 118 via the transmitter/receiver switch 115 and a bandpass filter 117.

The received RF signal amplified by the low-noise amplifier 118 is input to a down converter 120 via an image removal filter 119. The down converter 120 multiplies the first local signal of frequency fLO1 generated by the local oscillator 112 with the received RF signal, to frequency-convert (down-convert) the received RF signal to an IF signal. The IF signal output by the down converter 120 is input to an orthogonal demodulator 125 constructed by a divider (not shown) and multipliers 123 and 124 via a bandpass filter 121 and a variable gain amplifier 122. To the orthogonal demodulator 125 is supplied the second local signals of orthogonal frequencies fLO2 which are generated via a 90° phase shifter (90°-PS) 108 from the second local oscillator 106, similarly to the orthogonal modulator 105 of the transmitter. The outputs Ich(RX) and Qch(RX) of the orthogonal demodulator 125 are input to a receiver baseband processor (RX-BB) 126, to demodulate the received signal and reproduce an original data signal.

In the above radio communication apparatus, the frequency converter is applied to one or both of the up converter 111 and down converter 120. As a result, a radio communication apparatus having low distortion property, low-current operation, and miniaturization can be realized.

As described above, the present invention can provide a frequency converter that can reduce distortion effectively without increasing an operating current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A frequency converter supplied with an input signal and a local signal, comprising:

a first mixer which is supplied with the input signal and frequency-converts the input signal with a first conversion gain in accordance with the local signal, to generate a first output signal;

a second mixer which frequency-converts the input signal same as that input to the first mixer with a second conversion gain lower than the first conversion gain in accordance with the local signal, to generate a second output signal; and an adder which adds the first output signal and the second output signal in opposite phase to each other, to generate a frequency-converted output signal.

2. A frequency converter according to claim 1, wherein the first mixer comprises a first transconductance amplifier configured to convert the input signal to a first current signal, and a first current switch supplied with the first current signal, the first current switch performing an switching operation according to the local signal to frequency-convert the first current signal and generate the first output signal, and the second mixer comprises a second transconductance amplifier configured to convert the input signal to the second current signal, and a second current switch supplied with the second current signal, the second current switch performing an switching operation according to the local signal to frequency-convert the second current signal and generate the second output signal.

3. A frequency converter according to claim 2, wherein if transconductances of the first transconductance amplifier and the second transconductance amplifier are Gm1 and Gm2, and operating currents of the first transconductance amplifier and the second transconductance amplifier are I1 and I2, Gm1=M×Gm2 (M is larger than 3) and I1=L×I2 (L is larger than M).

4. A frequency converter according to claim 2, wherein the first transconductance amplifier comprises at least one first transistor having a control electrode that receives the input signal and a first main electrode outputting the first current signal and a second main electrode, and at least one first degeneration impedance element connected between the second main electrode of the first transistor and a constant potential point, and the second transconductance amplifier comprises at least one second transistor having a control electrode that receives the input signal and a first main electrode outputting the first current signal and a second main electrode, and at least one second degeneration impedance element connected between the second main electrode of the second transistor and the constant potential point.

5. A frequency converter comprising:
- a first mixer supplied with an input signal and a first local signal, which frequency-converts the input signal with a first conversion gain in accordance with the first local signal, to generate a first output signal;
- a second mixer supplied with the input signal and a second local signal whose phase differs from that of the first local signal, the second mixer frequency-converting the input signal with a second conversion gain lower than the first conversion gain in accordance with the second local signal, to generate a second output signal; and
- an adder which adds the first output signal and the second output signal in opposite phase to each other, to generates a frequency-converted output signal.

6. A frequency converter according to claim 5 and supplied with an original local signal from a local oscillator, which further includes a phase shifter which is supplied with the original local signal and phase-shifts the original local signal to generate the first local signal and the second local signal.

7. A frequency converter according to claim 6, wherein the phase shifter includes an integrator constructed by a series circuit of a first resistor and a first capacitor and a differentiator connected in series with the integrator and constructed by a series circuit of a second capacitor and a second resistor, the phase shifter being configured to input the original local signal to both terminals of the integrator and the differentiator, extract the original local signal as the first local signal, and extract a difference between an output of the integrator and an output of the differentiator as the second local signal.

8. A frequency converter according to claim 5, wherein the first mixer comprises a first transconductance amplifier configured to convert the input signal to a first current signal, and a first current switch supplied with the first current signal, the first current switch performing an switching operation according to the first local signal to frequency-convert the first current signal and generate the first output signal, and the second mixer comprises a second transconductance amplifier configured to convert the input signal to the second current signal, and a second current switch supplied with the second current signal, the second current switch performing an switching operation according to the second local signal to frequency-convert the second current signal and generate the second output signal.

9. A frequency converter according to claim 8, wherein the first transconductance amplifier comprises at least one first transistor having a control electrode that receives the input signal and a first main electrode outputting the first current signal and a second main electrode, and at least one first degeneration impedance element connected between the second main electrode of the first transistor and a constant potential point, and the second transconductance amplifier comprises at least one second transistor having a control electrode that receives the input signal and a first main electrode outputting the second current signal and a second main electrode, and at least one second degeneration impedance element connected between the second main electrode of the second transistor and the constant potential point.

10. A frequency converter according to claim 8, wherein if transconductances of the first transconductance amplifier and the second transconductance amplifier are Gm1 and Gm2, and operating currents of the first transconductance amplifier and the second transconductance amplifier are I1 and I2, Gm1=M×Gm2 (M is larger than 3) and I1=L×I2 (L is larger than M).

11. A frequency converter according to claim 10, wherein the first transconductance amplifier comprises at least one first transistor having a control electrode that receives the input signal and a first main electrode outputting the first current signal and a second main electrode, and at least one first degeneration impedance element connected between the second main electrode of the first transistor and a constant potential point, and the second transconductance amplifier comprises at least one second transistor having a control electrode that receives the input signal and a first main electrode outputting the first current signal and a second main electrode, and at least one second degeneration impedance element connected between the second main electrode of the second transistor and the constant potential point.

12. A frequency converter according to claim 11, wherein the first degeneration impedance element and the second degeneration impedance element are formed of the same kinds of elements selected among resistors, inductances and capacitors.

13. A frequency converter according to claim 11, wherein the first degeneration impedance element is one selected from a resistor, an inductance and a capacitor, the second degeneration impedance element is one selected among a resistor, an inductance and a capacitor, and different in kind from the first degeneration impedance element.

14. A frequency converter according to claim 13, wherein the first degeneration impedance element is the inductance, and the second degeneration impedance element is the resistor or capacitor.

15. A radio communication apparatus comprising:
- a transmitting unit including a first frequency converter which frequency-converts a transmission signal; and
- a receiving unit including a second frequency converter which frequency-converts a received signal,
- at least one of the first frequency converter and the second frequency converter being constructed by the frequency converter according to claim 1.

16. A frequency converter comprising:
- a first mixer supplied with an input signal and a first local signal, and configured to frequency-convert the input signal with a first conversion gain in accordance with the first local signal, to generate a first output signal;
- a second mixer supplied with the input signal and a second local signal whose phase differs from that of the first local signal, and configured to frequency-convert the input signal with a second conversion gain lower than the first conversion gain in accordance with the second local signal and generate a second output signal;
- an adder which adds the first output signal and the second output signal in opposite phase to each other, to generates a frequency-converted output signal; and
- a phase shifter supplied with an original local signal, and configured to phase-shift the original local signal and generate the first local signal and the second local signal.

17. A frequency converter supplied with an input signal and a local signal, comprising:
- a first mixer which is supplied with the input signal and frequency-converts the input signal with a first conversion gain in accordance with the local signal to generate a first output signal;
- a second mixer which frequency-converts the same input signal as that input to the first mixer with a second conversion gain lower than the first conversion gain in accordance with the local signal and is operated with an operating current lower than that of the first mixer to generate a second output signal; and
- an adder which adds the first output signal and the second output signal in opposite phase to each other to generate a frequency-converted output signal.

18. A frequency converter supplied with an input signal and a local signal, comprising:
- a first mixer which is supplied with the input signal and frequency-converts the input signal with a first conversion gain in accordance with the local signal to generate a first output containing a third order distortion;
- a second mixer which frequency-converts the same input signal as that input to the first mixer with a second conversion gain lower than the first conversion gain in accordance with the local signal and is operated with an operating current lower than that of the first mixer to generate a second output containing a third order distortion having substantially the same level as that of the first output of the first mixer; and
- an adder which adds the first output signal and the second output signal in opposite phase to each other, to generate a frequency-converted output signal.

19. A frequency converter supplied with an input signal and a local signal, comprising:
- a first mixer supplied with the input signal and configured to frequency-convert the input signal in accordance with the local signal to generate a first output signal;
- a second mixer configured to frequency-convert the input signal same as that supplied to the first mixer in accordance with the local signal to generate a second output signal, the second mixer being designed so as to have a conversion gain lower than that of the first mixer and generate the second output signal containing a third order distortion having substantially the same level as that of the first output signal of the first mixer; and
- an adder which adds the first output signal and the second output signal in opposite phase to each other, to generate a frequency-converted output signal.

* * * * *